United States Patent
Lin (10) Patent No.: US 11,987,902 B2
(45) Date of Patent: May 21, 2024

(54) MANUFACTURING METHOD OF SILICON CARBIDE WAFER AND SEMICONDUCTOR STRUCTURE

(71) Applicant: GlobalWafers Co., Ltd., Hsinchu (TW)

(72) Inventor: Ching-Shan Lin, Hsinchu (TW)

(73) Assignee: GlobalWafers Co., Ltd., Hsinchu (TW)

( * ) Notice: Subject to any disclaimer, the term of this patent is extended or adjusted under 35 U.S.C. 154(b) by 225 days.

(21) Appl. No.: 17/385,906

(22) Filed: Jul. 27, 2021

(65) Prior Publication Data

US 2022/0025547 A1   Jan. 27, 2022

Related U.S. Application Data (60) Provisional application No. 63/056,732, filed on Jul. 27, 2020.

(51) Int. Cl.
| | | |
|---|---|---|
| *H01L 29/16* | (2006.01) | |
| *C30B 23/00* | (2006.01) | |
| *C30B 23/06* | (2006.01) | |
| *C30B 29/36* | (2006.01) | |

(52) U.S. Cl.
CPC .............. *C30B 29/36* (2013.01); *C30B 23/002* (2013.01); *C30B 23/066* (2013.01); *H01L 29/1608* (2013.01)

(58) Field of Classification Search
CPC ......... C30B 29/36; C30B 29/06; C30B 33/02; C30B 23/066; C30B 17/00; H01L 29/1608; H01L 21/02529; H01L 21/02378
See application file for complete search history.

(56) References Cited

U.S. PATENT DOCUMENTS

| | | | |
|---|---|---|---|
| 7,972,704 B2 | 7/2011 | Ohtani et al. | |
| 8,858,709 B1 * | 10/2014 | Zwieback | C30B 23/00 117/88 |
| 9,017,629 B2 | 4/2015 | Zwieback et al. | |

(Continued)

FOREIGN PATENT DOCUMENTS

| | | |
|---|---|---|
| CN | 102701208 | 10/2012 |
| CN | 108118394 | 6/2018 |

(Continued)

OTHER PUBLICATIONS

"Office Action of Taiwan Counterpart Application", dated Dec. 17, 2021, pp. 1-8.

(Continued)

*Primary Examiner* — Jaehwan Oh
(74) *Attorney, Agent, or Firm* — JCIPRNET (57) ABSTRACT

A manufacturing method of a silicon carbide wafer includes the following. A raw material containing carbon and silicon and a seed located above the raw material are provided in a reactor. A nitrogen content in the reactor is reduced, which includes the following. An argon gas is passed into the reactor, where a flow rate of passing the argon gas into the reactor is 1,000 sccm to 5,000 sccm, and a time of passing the argon gas into the reactor is 2 hours to 48 hours. The reactor and the raw material are heated to form a silicon carbide material on the seed. The reactor and the raw material are cooled to obtain a silicon carbide ingot. The silicon carbide ingot is cut to obtain a plurality of silicon carbide wafers. A semiconductor structure is also provided.

5 Claims, 7 Drawing Sheets

(56) References Cited

U.S. PATENT DOCUMENTS

| | | | |
|---|---|---|---|
| 2005/0126471 A1* | 6/2005 | Jenny | C30B 33/00 117/92 |
| 2005/0247259 A1* | 11/2005 | Yoon | H01L 21/3225 257/E21.321 |
| 2006/0091402 A1* | 5/2006 | Shiomi | C30B 29/36 257/77 |
| 2007/0102692 A1* | 5/2007 | Asahara | H01L 33/387 257/13 |
| 2008/0038531 A1* | 2/2008 | Sawamura | C30B 23/00 501/88 |
| 2009/0169459 A1* | 7/2009 | Zwieback | H01L 21/02631 423/346 |
| 2011/0024650 A1 | 2/2011 | Kolodzey et al. | |
| 2011/0030611 A1* | 2/2011 | Santailler | C30B 23/066 427/126.3 |
| 2012/0025153 A1* | 2/2012 | Hirose | H01B 1/04 252/516 |
| 2012/0275984 A1* | 11/2012 | Nishiguchi | C30B 23/025 117/106 |
| 2012/0308758 A1* | 12/2012 | Hori | C30B 23/00 428/64.1 |
| 2013/0153836 A1* | 6/2013 | Miyamoto | C30B 29/36 252/516 |
| 2014/0295171 A1* | 10/2014 | Hori | C30B 25/14 428/332 |
| 2015/0191849 A1* | 7/2015 | Shirai | C30B 9/06 428/446 |
| 2015/0225873 A1* | 8/2015 | Fujiwara | C30B 29/36 117/84 |
| 2015/0259829 A1* | 9/2015 | Seki | C30B 33/10 134/3 |
| 2017/0137963 A1* | 5/2017 | Loboda | C30B 23/025 |
| 2018/0044186 A1* | 2/2018 | Lynch | C01B 32/956 |
| 2018/0187332 A1* | 7/2018 | Powell | C30B 33/00 |
| 2019/0252504 A1* | 8/2019 | Eto | C30B 23/06 |
| 2019/0362972 A1 | 11/2019 | Schulze et al. | |
| 2021/0115592 A1* | 4/2021 | Park | C01B 32/956 |
| 2021/0225645 A1* | 7/2021 | Gendron-Hansen | H01L 21/02274 |
| 2021/0242319 A1* | 8/2021 | Sheridan | H01L 29/0696 |
| 2021/0273117 A1* | 9/2021 | Hoshi | H01L 29/7815 |
| 2022/0002905 A1* | 1/2022 | Yabuki | C30B 25/186 |

FOREIGN PATENT DOCUMENTS

| | | |
|---|---|---|
| CN | 109628999 | 4/2019 |
| CN | 109676437 | 4/2019 |
| CN | 111063730 | 4/2020 |
| JP | 2003104798 | 4/2003 |
| JP | 2013100217 | 5/2013 |
| WO | 0039371 | 7/2000 |
| WO | 2020059810 | 3/2020 |

OTHER PUBLICATIONS

Feng, Bin et al., "A Fine Processing Technology of Silicon Carbide", Equipment for Electronic Products Manufacturing, May 20, 2013, with English abstract, pp. 23-26,64, vol. 42, No. 5.

"Office Action of China Counterpart Application", issued on Jan. 16, 2024, p. 1-p. 9.

* cited by examiner

MANUFACTURING METHOD OF SILICON CARBIDE WAFER AND SEMICONDUCTOR STRUCTURE

CROSS-REFERENCE TO RELATED APPLICATION

This application claims the priority benefit of U.S. provisional application Ser. No. 63/056,732, filed on Jul. 27, 2020. The entirety of the above-mentioned patent application is hereby incorporated by reference herein and made a part of this specification.

BACKGROUND

Technical Field

The disclosure relates to a manufacturing method of a silicon carbide wafer and a semiconductor structure.

Description of Related Art

At present, silicon wafers have been widely applied in the semiconductor industry. Many electronic devices contain silicon chips made from silicon wafers. However, in order to improve the chip performance, many manufacturers are currently making attempts to employ silicon carbide wafers as materials for producing silicon carbide chips. The silicon carbide chip has high temperature resistance and high stability.

In a common semiconductor manufacturing process, it is often required to set an alignment mark on a surface of the wafer, and capture a position of the alignment mark with an optical imaging module (e.g., a CCD camera), then confirming a position of the wafer. By the setting of the alignment mark, deviation in the semiconductor manufacturing process may be reduced. However, it is common that the silicon carbide wafer is in a dark brown color, and a transparency thereof is not great. Therefore, during confirmation of the position of the silicon carbide wafer by utilizing the alignment mark, since the transparency of the silicon carbide wafer may be overly low, the position of the silicon carbide wafer is likely to be deviated, which further leads to an insufficient process yield in the semiconductor manufacturing process.

SUMMARY

The disclosure provides a manufacturing method of a silicon carbide wafer, in which insufficient visible light transmittance of the silicon carbide wafer may be improved.

At least one embodiment of the disclosure provides a manufacturing method of a silicon carbide wafer, including the following. A raw material containing carbon and silicon and a seed located above the raw material are provided in a reactor. A nitrogen content in the reactor is reduced, which includes the following. An argon gas is passed into the reactor, where a flow rate of passing the argon gas into the reactor is 1,000 sccm to 5,000 sccm, and a time of passing the argon gas into the reactor is 2 hours to 48 hours. The reactor and the raw material are heated to form a silicon carbide material on the seed. The reactor and the raw material are cooled to obtain a silicon carbide ingot. The silicon carbide ingot is cut to obtain a plurality of silicon carbide wafers.

At least one embodiment of the disclosure provides a semiconductor structure. The semiconductor structure includes a silicon carbide wafer. A resistivity of the silicon carbide wafer is 0.1 ohm/cm to 10 ohms/cm, and a visible light transmittance of the silicon carbide wafer is greater than 50%.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

FIG. 1A to FIG. 1G are schematic cross-sectional views of a manufacturing method of a silicon carbide wafer according to an embodiment of the disclosure.

Figure 1A:
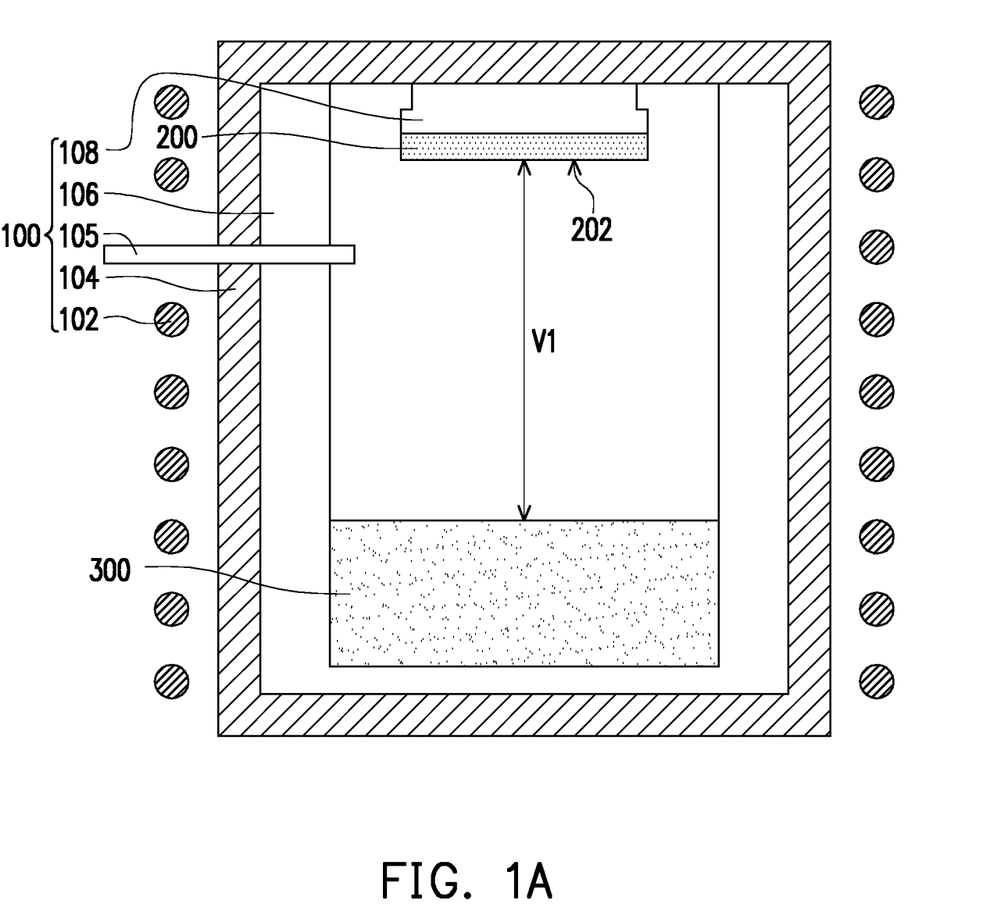
FIG. 1A to FIG. 1G are schematic cross-sectional views of a manufacturing method of a silicon carbide wafer according to an embodiment of the disclosure.

With reference to FIG. 1A, a reactor 100 includes an induction coil 102, a furnace body 104, a pipeline 105, a graphite crucible 106, and a seed support member 108. The graphite crucible 106 and the seed support member 108 are disposed in the furnace body 104. The induction coil 102 is disposed outside the graphite crucible 106.

A raw material 300 and a seed 200 located above the raw material 300 are provided in the reactor 100. The raw material 300 and the seed 200 are spaced apart by a vertical distance V1.

The raw material 300 is disposed in the graphite crucible 106. The raw material 300 contains carbon and silicon, and the raw material 300 is, for example, silicon carbide powder. The seed 200 is disposed on the seed support member 108. In some embodiments, the seed 200 is fixed on the seed support member 108 by an adhesive layer (not shown). The material of the seed 200 includes silicon carbide. For example, the seed 200 is 6H-silicon carbide or 4H-silicon carbide.

In some embodiment, a first surface 202 of the seed 200 has a surface roughness (Ra) less than 2 nm, preferably a surface roughness (Ra) less than 0.5 nm, and more preferably a surface roughness (Ra) less than 0.3 nm. In some embodiment, the seed 200 has a total thickness variation (TTV) of less than 2 μm, a warp less than 30 μm, and a bow less than ±20 μm. In some embodiments, the first surface 202 of the seed 200 is the basal plane (0001) of silicon carbide.

In this embodiment, when the raw material 300 and the seed 200 are disposed in the reactor 100, air from the outside will enter the reactor 100 together, such that oxygen, nitrogen, and other gases are contained in the reactor 100.

Figure 1B:
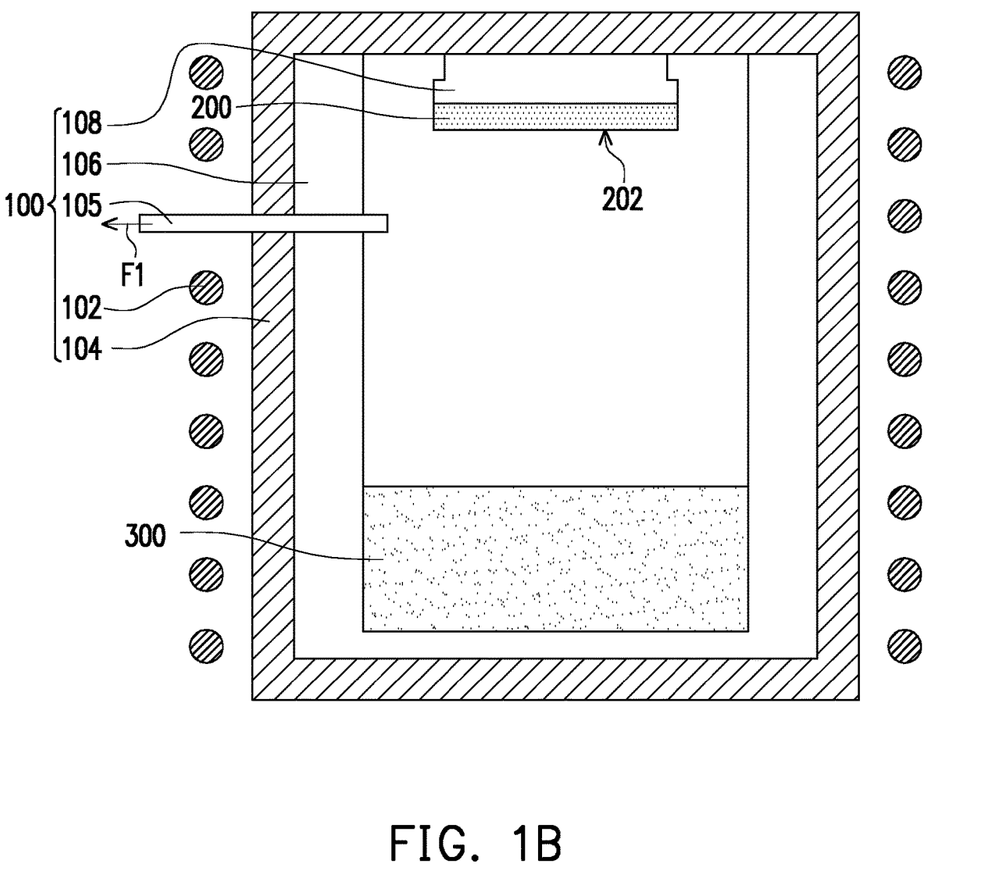
Figure 1C:
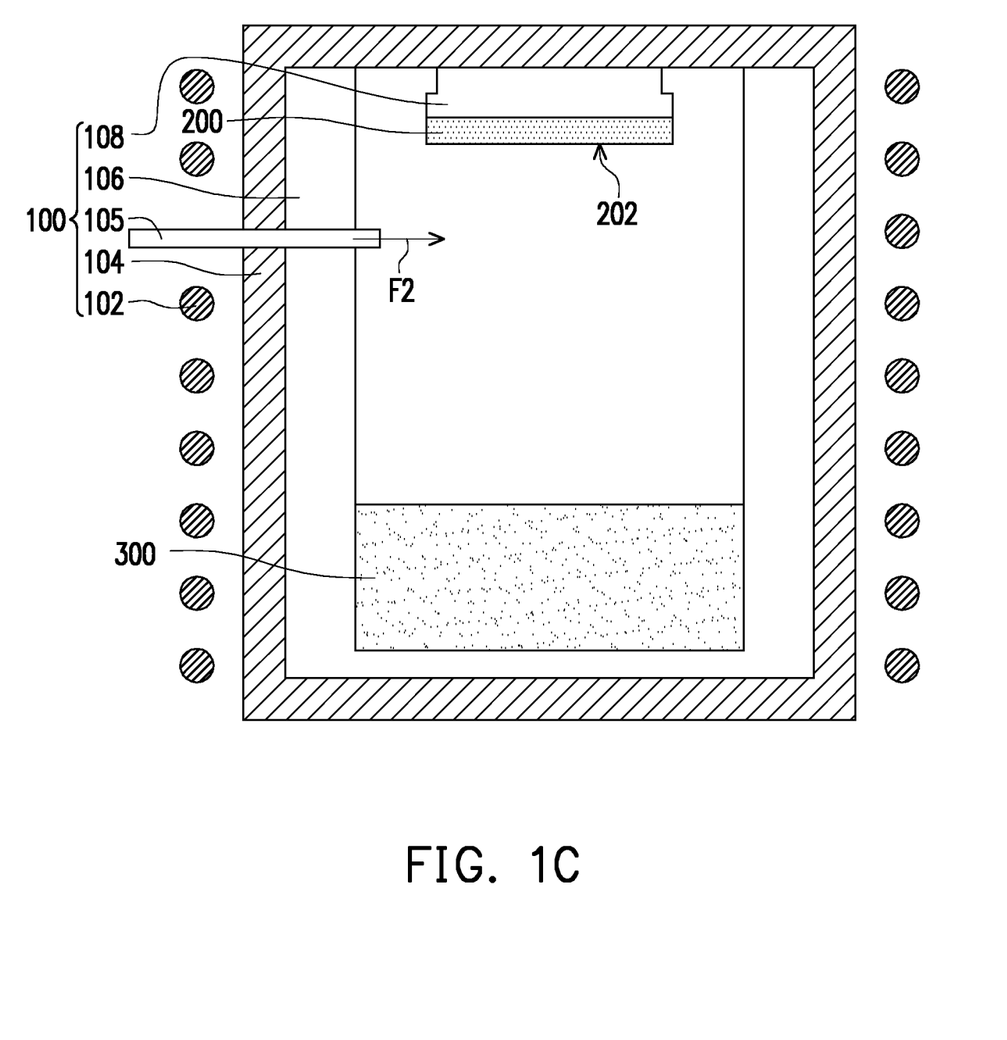
Figure 1D:
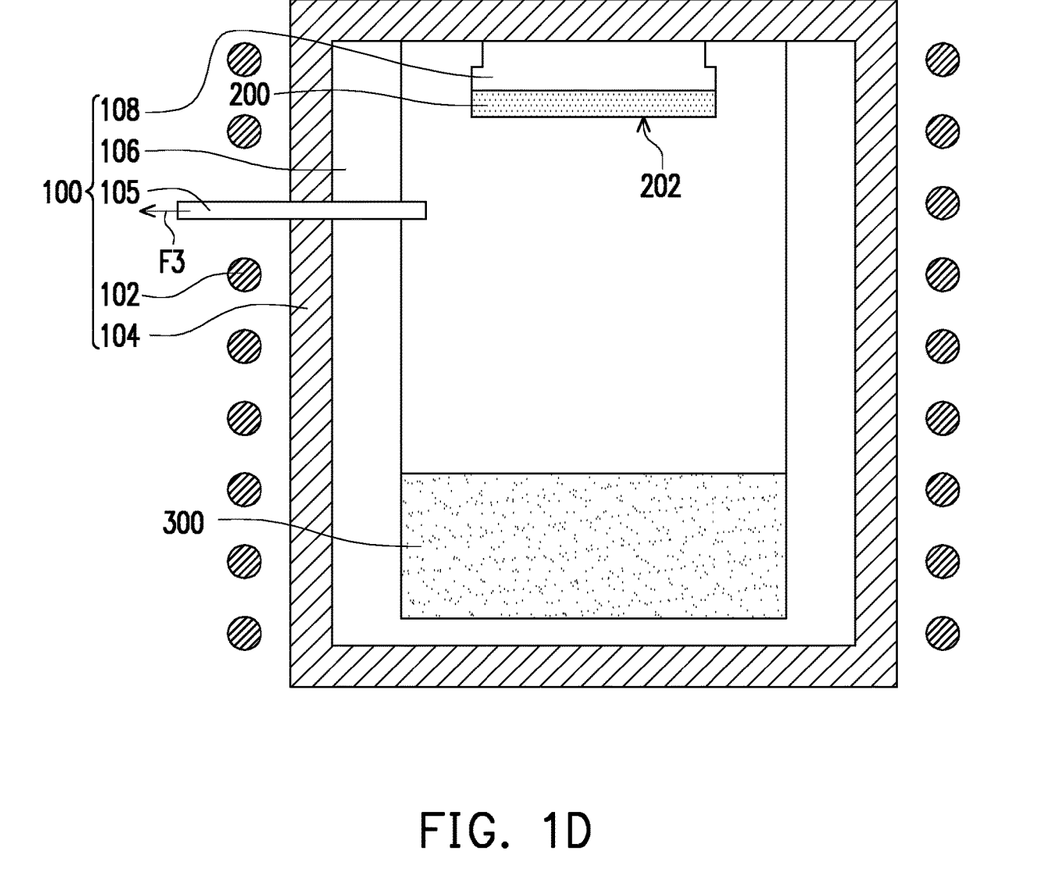

With reference to FIG. 1B to FIG. 1D, a nitrogen content in the reactor 100 is reduced. In some embodiments, the reducing of the nitrogen content in the reactor 100 includes a first vacuum process F1, a gas transport process F2, and a second vacuum process F3.

With reference to FIG. 1B, the first vacuum process F1 is performed on the reactor 100 through the pipeline 105, such that an air pressure in the reactor is 0.1 torr to 100 torr (preferably 0.1 torr to 20 torr). Oxygen, nitrogen, and other gases may be discharged from the reactor 100 by the first vacuum process F1. However, a small amount of nitrogen may still be contained in the reactor 100.

With reference to FIG. 1C, the gas transport process F2 is performed on the reactor 100 through the pipeline 105. The gas transport process F2 includes passing an argon gas into the reactor 100, where a flow rate of passing the argon gas into the reactor 100 is 1,000 sccm to 5,000 sccm, and a time of passing the argon gas into the reactor 100 is 2 hours to 48 hours. The argon gas passed into the reactor 100 may dilute the residual nitrogen in the reactor 100, helping to squeeze out the nitrogen in the gaps of the raw material 300 or the nitrogen adsorbed on the surface of the raw material 300.

With reference to FIG. 1D, after the argon gas is passed into the reactor 100 through the pipeline 105, the second vacuum process F3 is optionally performed on the reactor 100, such that the air pressure in the reactor 100 is less than $5 \times 10^{-5}$ torr, and more preferably, the air pressure in the reactor 100 is less than $1 \times 10^{-5}$ torr.

In FIG. 1B to FIG. 1D, the first vacuum process F1, the gas transport process F2, and the second vacuum process F3 are each performed through the same pipeline 105, but the disclosure is not limited thereto. In other embodiments, the first vacuum process F1, the gas transport process F2, and the second vacuum process F3 may be performed through different pipelines.

Figure 1E:
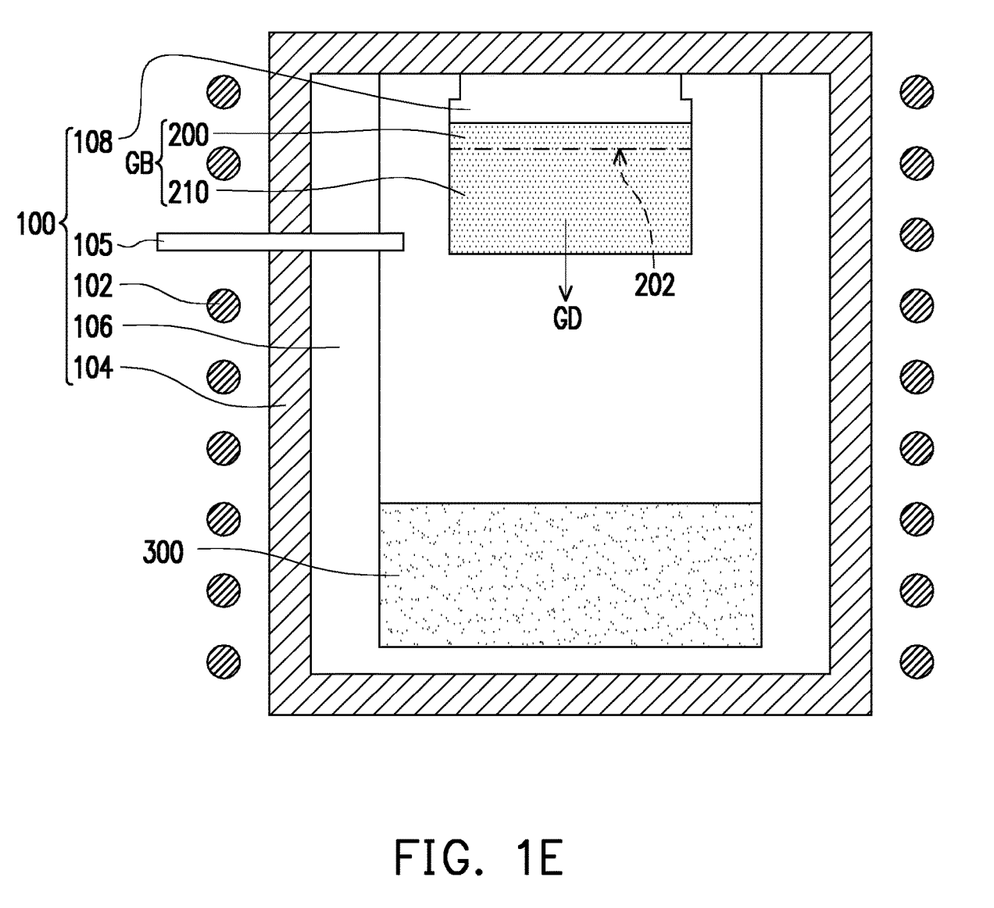

With reference to FIG. 1E, a silicon carbide material 210 is formed on the seed 200 by physical vapor transport (PVT). In this embodiment, the reactor 100 and the raw material 300 are heated by the induction coil 102, such that the silicon carbide material 210 is formed on the first surface 202 of the seed 200.

In this embodiment, when the raw material 300 at the bottom of the graphite crucible 106 is heated to a high temperature (higher than 1900° C., for example) by the induction coil 102, the raw material 300 is sublimated, and, under the drive of a temperature gradient, is transmitted to the first surface 202 of the seed 200 and form the silicon carbide material 210 on the seed 200, to form a growth body GB containing the seed 200 and the silicon carbide material 210. The growth body GB grows along a growth direction GD perpendicular to the first surface 202 of the seed 200.

In some embodiments, the silicon carbide material 210 is not only formed on the first surface 202 of the seed 200, but also formed on the sidewall of the seed 200. In other words, the growth body GB may also grow along the radial direction of the seed 200.

Figure 1F:
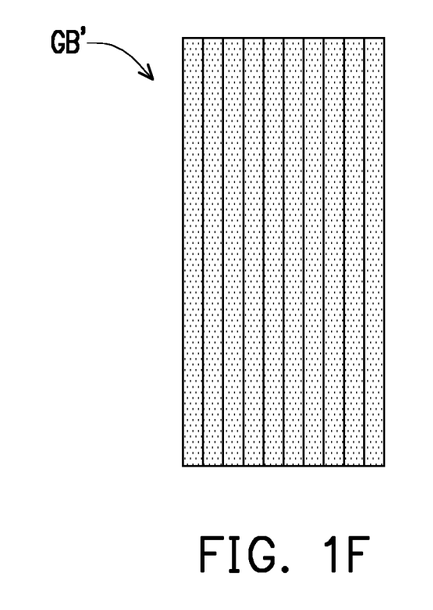

With reference to FIG. 1F, after the growth body GB grows to an expected size, the reactor 100 and the raw material 300 are cooled to obtain a silicon carbide ingot GB'.

The silicon carbide ingot GB' is taken out of the reactor 100. In some embodiments, a nitrogen content of the silicon carbide ingot GB' is $10^{16}$ atoms/cm³ to $10^{17}$ atoms/cm³. In some embodiments, a resistivity of the silicon carbide ingot is 0.1 ohm/cm to 10 ohms/cm. In some embodiments, a thickness of the silicon carbide ingot is 5 millimeters (mm) to 80 mm, for example, 5 mm to 50 mm or 5 mm to 30 mm.

Figure 1G:
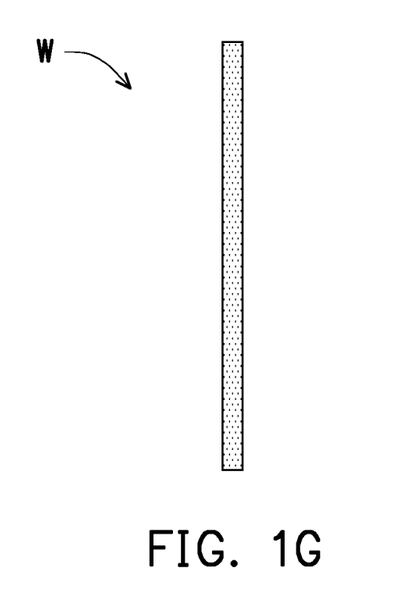

With reference to FIG. 1G, the silicon carbide ingot GB' is cut to obtain a plurality of silicon carbide wafers W. A thickness of each silicon carbide wafer W is less than 1,000 micrometers. A diameter of each silicon carbide wafer W is greater than 75 mm.

In some embodiments, a nitrogen content of each silicon carbide wafer W is $10^{16}$ atoms/cm³ to $10^{17}$ atoms/cm³. A resistivity of each silicon carbide wafer W is 0.1 ohm/cm to 10 ohms/cm. Since the resistivity of the silicon carbide wafer W is lower than 10 ohms/cm, in the subsequent semiconductor manufacturing process, the silicon carbide wafer W may be moved by electrostatic adsorption.

In this embodiment, a visible light transmittance of the silicon wafer carbide W obtained based on the above manufacturing process is greater than 50%, preferably greater than 70%, and more preferably greater than 80%. The visible light is defined as light with a wavelength of 380 nanometers to 750 nanometers. In some embodiments, the silicon carbide wafer W is approximately transparent. In this embodiment, silicon carbide in the silicon carbide wafer W has a c-axis with a deflection angle of less than 0.5 degrees. Accordingly, polarization caused by the silicon carbide wafer W may be improved.

In some embodiments, after the silicon carbide wafer W is completed, an alignment mark (not shown) is formed on the silicon carbide wafer W. The alignment mark may be adapted for confirming a position of the silicon carbide wafer W. Since the silicon carbide wafer W has a great visible light transmittance, the position of the silicon carbide wafer W may be more accurately confirmed by the alignment mark, thereby improving the manufacturing yield in the subsequent semiconductor manufacturing process. For example, in some embodiments, when a back side via process is performed on the silicon carbide wafer W, the alignment mark may be configured to confirm the position of the silicon carbide wafer W, thereby preventing a position of the obtained via from deviation.

Figure 2:
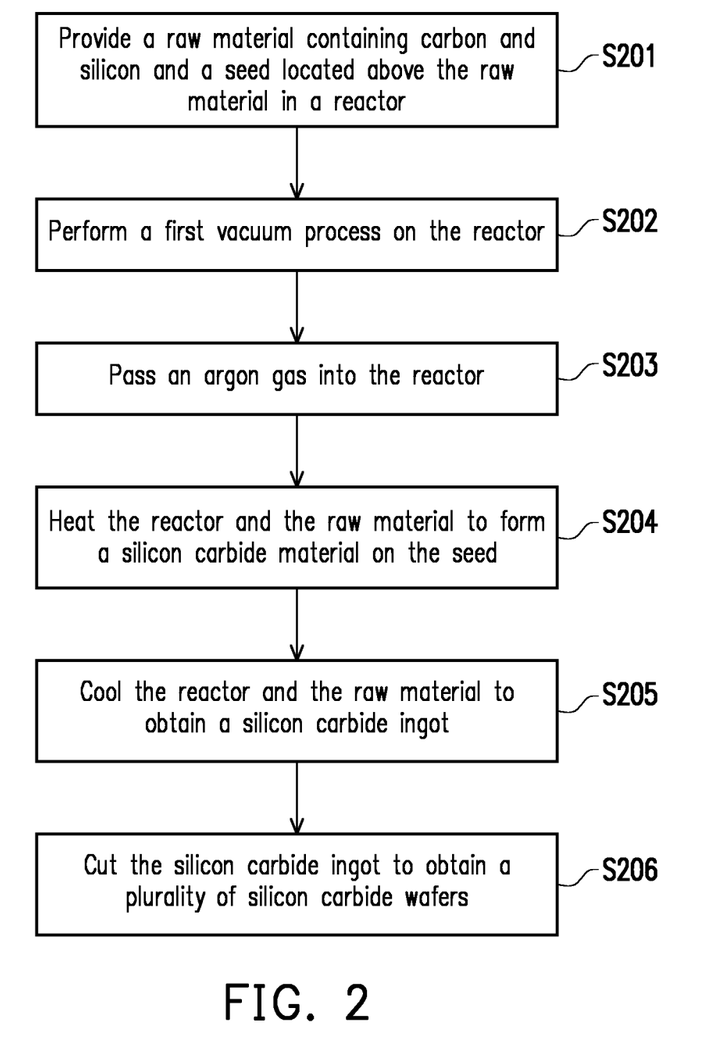
FIG. 2 is a flowchart of a manufacturing method of a silicon carbide wafer according to an embodiment of the disclosure.

FIG. 2 is a flowchart of a manufacturing method of a silicon carbide wafer according to an embodiment of the disclosure.

With reference to FIG. 2, in step S201, a raw material containing carbon and silicon and a seed located above the raw material are provided in a reactor.

In step S202, a first vacuum process is performed on the reactor.

In step S203, an argon gas is passed into the reactor.

In step S204, the reactor and the raw material are heated to form a silicon carbide material on the seed.

In step S205, the reactor and the raw material are cooled to obtain a silicon carbide ingot.

In step S206, the silicon carbide ingot is cut to obtain a plurality of silicon carbide wafers.

Several experiments are provided as follows to verify the effects of the disclosure, but the content of the experiments are not intended to limit the scope of the disclosure.

Preparation Example 1

A silicon carbide wafer was manufactured by utilizing physical vapor transport. For the manufacturing method thereof, reference may be made to FIG. 1A to FIG. 1G.

In <Preparation example 1>, a flow rate of the argon gas in the gas transport process F2 (shown in FIG. 1C) was 1,000 sccm to 2,000 sccm, and a time of passing the argon gas into the reactor 100 was 2 hours.

A nitrogen content of the silicon carbide wafer obtained from <Preparation example 1> was $1 \times 10^{16}$ atoms/cm³ to $9 \times 10^{17}$ atoms/cm³, and a resistivity of the silicon carbide wafer was 0.03 ohm/cm to 50 ohms/cm.

Preparation Example 2

A silicon carbide wafer was manufactured by utilizing physical vapor transport. For the manufacturing method thereof, reference may be made to FIG. 1A to FIG. 1G.

In <Preparation example 2>, a flow rate of the argon gas in the gas transport process F2 (shown in FIG. 1C) was 2,000 sccm to 3,000 sccm, and a time of passing the argon gas into the reactor 100 was 3 hours.

A nitrogen content of the silicon carbide wafer obtained from <Preparation example 2> was $2\times10^{16}$ atoms/cm$^3$ to $7\times10^{17}$ atoms/cm$^3$, and a resistivity of the silicon carbide wafer was 0.05 ohm/cm to 30 ohms/cm.

Preparation Example 3

A silicon carbide wafer was manufactured by utilizing physical vapor transport. For the manufacturing method thereof, reference may be made to FIG. 1A to FIG. 1G.

In <Preparation example 3>, a flow rate of the argon gas in the gas transport process F2 (shown in FIG. 1C) was 3,000 sccm to 4,000 sccm, and a time of passing the argon gas into the reactor 100 was 4 hours.

A nitrogen content of the silicon carbide wafer obtained from <Preparation example 3> was $3\times10^{16}$ atoms/cm$^3$ to $6\times10^{17}$ atoms/cm$^3$, and a resistivity of the silicon carbide wafer was 0.1 ohm/cm to 10 ohms/cm.

Preparation Example 4

A silicon carbide wafer was manufactured by utilizing physical vapor transport. For the manufacturing method thereof, reference may be made to FIG. 1A to FIG. 1G.

In <Preparation example 4>, a flow rate of the argon gas in the gas transport process F2 (shown in FIG. 1C) was 4,000 sccm to 5,000 sccm, and a time of passing the argon gas into the reactor 100 was 5 hours.

A nitrogen content of the silicon carbide wafer obtained from <Preparation example 4> was $4\times10^{16}$ atoms/cm$^3$ to $5\times10^{17}$ atoms/cm$^3$, and a resistivity of the silicon carbide wafer was 1 ohm/cm to 5 ohms/cm.

For the relevant parameters in <Preparation example 1> to <Preparation example 4>, see Table 1 below.

TABLE 1

| Preparation example | Flow rate (sccm) of argon gas in gas transport process F2 | Time (hour) of passing argon gas in gas transport process F2 | Nitrogen content of silicon carbide wafer (atom/cm$^3$) | Resistivity of silicon carbide wafer (ohm/cm) |
|---|---|---|---|---|
| 1 | 1,000 to 2,000 | 2 | $1 \times 10^{16}$ to $9 \times 10^{17}$ | 0.03 to 50 |
| 2 | 2,000 to 3,000 | 3 | $2 \times 10^{16}$ to $7 \times 10^{17}$ | 0.05 to 30 |
| 3 | 3,000 to 4,000 | 4 | $3 \times 10^{16}$ to $6 \times 10^{17}$ | 0.1 to 10 |
| 4 | 4,000 to 5,000 | 5 | $4 \times 10^{16}$ to $5 \times 10^{17}$ | 1 to 5 |

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a silicon carbide wafer, comprising:
   providing a raw material containing carbon and silicon and a seed located above the raw material in a reactor;
   reducing a nitrogen content in the reactor, comprising:
      performing a first vacuum process on the reactor, such that an air pressure in the reactor is 0.1 torr to 100 torr;
      after the first vacuum process, passing an argon gas into the reactor, wherein a flow rate of passing the argon gas into the reactor is 1,000 sccm to 5,000 sccm, and a time of passing the argon gas into the reactor is 2 hours to 48 hours; and
      after passing the argon gas into the reactor, performing a second vacuum process on the reactor, such that an air pressure in the reactor is less than $5\times10^{-5}$ torr;
   heating the reactor and the raw material to form a silicon carbide material on the seed;
   cooling the reactor and the raw material to obtain a silicon carbide ingot; and
   cutting the silicon carbide ingot to obtain a plurality of silicon carbide wafers, wherein a resistivity of each of the silicon carbide wafers is 0.1 ohm/cm to 10 ohms/cm, wherein a visible light transmittance of each of the silicon carbide wafers is greater than 50%.

2. The manufacturing method as described in claim 1, wherein a resistivity of the silicon carbide ingot is 0.1 ohm/cm to 10 ohms/cm.

3. The manufacturing method as described in claim 1, wherein a thickness of the silicon carbide ingot is 5 millimeters to 80 millimeters, and a thickness of each of the silicon carbide wafers is less than 1,000 micrometers.

4. The manufacturing method as described in claim 1, wherein a nitrogen content of the silicon carbide ingot is $10^{16}$ atoms/cm$^3$ to $10^{17}$ atoms/cm$^3$.

5. The manufacturing method as described in claim 1, wherein a nitrogen content of each of the silicon carbide wafers is $10^{16}$ atoms/cm$^3$ to $10^{17}$ atoms/cm$^3$.

* * * * *